United States Patent [19]

Takeda et al.

[11] Patent Number: 5,077,270

[45] Date of Patent: Dec. 31, 1991

[54] ELEMENTS COMPRISING A FILM OF A PEROVSKITE COMPOUND WHOSE CRYSTALLOGRAPHIC AXES ARE ORIENTED AND A METHOD OF MAKING SUCH ELEMENTS

[75] Inventors: Takeshi Takeda, Kawasaki; Sohji Tsuchiya, Kanagawa; Satoshi Sekido, Kawasaki; Yasuhiko Machida, Yokohama, all of Japan

[73] Assignee: Matsushita Electric Industrial Co., Ltd., Osaka, Japan

[21] Appl. No.: 173,748

[22] Filed: Mar. 25, 1988

[30] Foreign Application Priority Data

| Mar. 26, 1987 | [JP] | Japan | 62-72429 |
| Mar. 26, 1987 | [JP] | Japan | 62-72431 |
| Mar. 26, 1987 | [JP] | Japan | 62-72432 |
| Jun. 12, 1987 | [JP] | Japan | 62-147560 |

[51] Int. Cl.$^5$ .......................................... H01B 12/00
[52] U.S. Cl. ................................ 505/1; 204/192.15; 428/426; 428/432; 428/457; 428/688; 428/930
[58] Field of Search ............... 204/192.15, 192.18, 204/192.2, 192.22, 192.24; 252/62.9; 428/212, 446, 469, 701, 702, 426, 432, 457, 688, 930; 501/152, 134, 126; 505/826, 832

[56] References Cited

U.S. PATENT DOCUMENTS

| 4,045,375 | 8/1977 | Komatu ......................... 501/152 X |
| 4,244,722 | 1/1981 | Tsuya et al. .................... 501/134 X |
| 4,490,444 | 12/1984 | Isenberg .............................. 429/31 |
| 4,645,622 | 2/1987 | Koch . |
| 4,745,457 | 5/1988 | Morgan ........................... 501/127 X |
| 4,812,329 | 3/1989 | Isenberg ............................ 429/33 X |

OTHER PUBLICATIONS

H. Adachi et al., "Preparation . . . Thin Films", Jap. Jnl. of Applied Physics, vol. 26, No. 5, May 1987, pp. 709–710.

K. Moriwaki et al., "Electrical . . . Films", Proceedings of Symposium S, 1987 Spring Meeting of Mat. Res. Soc., pp. 85–87.

Primary Examiner—Nam X. Nguyen
Attorney, Agent, or Firm—Lowe, Price, LeBlanc & Becker

[57] ABSTRACT

Elements comprising a non-oriented substrate and a thin film of a compound of the following general formula $$La_{1-x-y}Sr_xBa_yMeO_{3-\delta}$$

in which $0 \leq x \leq 0.8$, $0 \leq y \leq 0.5$, $0.1 \leq x+y \leq 0.8$, and $0 \leq \delta \leq 0.5$ and Me is at least one member selected from the group consisting of Mn, Fe and Co. The film is crystallographically oriented in a certain direction The substrate is made of an amorphous material or a metal, or is constituted of an amorphous film formed on any bodies such as of a polycrystalline material. On the oriented thin film is further formed a perovskite oxide film or a superconductive film. The process for making the thin film of the above formula is also described.

21 Claims, 3 Drawing Sheets

ELEMENTS COMPRISING A FILM OF A PEROVSKITE COMPOUND WHOSE CRYSTALLOGRAPHIC AXES ARE ORIENTED AND A METHOD OF MAKING SUCH ELEMENTS

BACKGROUND OF THE INVENTION

1. Field of the Invention

This invention relates to electronic materials useful in the field of various electronic devices and more particularly, to electronic elements having a film of a perovskite compound whose crystallographic axes are oriented. The invention also relates to a method for making the oriented film. The term "oriented film" used herein is intended to mean a film of a crystalline material whose crystallographic axes are oriented in certain directions.

2. Description of the Prior Art

In recent years, many studies have been extensively made on thin films of perovskite compounds. Typical devices or elements using these thin films are pyroelectric heat detecting elements using $PbTiO_3$ films, optical modulation elements using PLZT (lead lanthanum zircono-titanate) thin films, and capacitor elements using $BaTiO_3$ thin films. For obtaining good electric or electronic characteristics, these thin film elements should be arranged in such a way that the crystallographic axes of the thin film are oriented in given directions. To this end, it is the usual practice to provide a single crystal such as MgO as a substrate and subject a perovskite compound to epitaxial growth on the substrate. Although the thin film of the perovskite compound formed on the single crystal substrate such as, for example, by sputtering exhibits a good orientation tendency, it is necessary to provide an electrode between the MgO single crystal substrate and the thin film for detection of signals when the thin films is applied as a pyroelectric heat detector element or device. This is disadvantageous in that the orientation tendency of the perovskite compund such as $PbTiO_3$ lowers. In addition, the single crystal substrate is very expensive.

SUMMARY OF THE INVENTION

It is accordingly an object of the present invention to provide a thin film of a perovskite compound whose crystallographic axes are oriented without use of any expensive single crystal substrate.

It is another object of the invention to provide an element which comprises a thin film of a perovskite compound having oriented crystallographic axes formed directly or indirectly on a substrate whose crystallographic axes are free of orientation.

It is a further object of the invention to provide an oriented film of a perovskite compound on which a thin film of another perovskite compound is formed as oriented.

It is a still further object of the invention to provide a superconductive thin film of a perovskite-like compound on an oriented thin film of a perovskite compound which is electrically conductive whereby the anisotropy of the superconductive thin film can be effectively utilized.

It is another object of the invention to provide a method for making an oriented film of a perovskite compound.

The present invention is based on the finding that a specific type of perovskite compound can be crystallographically oriented when formed as a film on a substrate whose crystallographic axes are not oriented. The formation of the film is usually effected by RF or DC sputtering. In order to permit the crystallographic axes of the film to be oriented, the sputtering conditions should be properly controlled. The conditions which predominantly influence the orientation tendency are a substrate temperature and sputtering power. These conditions may, more or less, vary depending upon the type of starting perovskite compound and the manner of orientation. In order to cause the thin film to be crystallographically oriented, the substrate temperature should be controlled to be in the range of from 200° to 700° C. and the sputtering power is from 0.80 to 3.30 $W/cm^2$. Moreover, the substrate to be deposited with the thin film should be non-oriented in nature. If the thin film is deposited directly on a polycrystalline substrate such as of alumina or zirconia, the thin film tends to undergo a lesser degree of the orientation than a thin film formed on an amorphous substrate. When a polycrystalline substrate is used, it is favorable to form an amorphous layer or film on such a polycrystalline substrate. In some cases, this is true of a metallic substrate. The term "non-oriented" means an "amorphous" or "polycrystalline" state. It will be noted that a metallic phase is a kind of polycrystal.

In accordance with one embodiment of the invention, there is provided an element which comprises a non-oriented substrate which is free of orientation of crystallographic axes, and a crystallographically oriented film of a compound of the following general formula (I) formed on the substrate

$$La_{1-x-y}Sr_xBa_yMeO_{3-\delta} \qquad (I)$$

in which $0 \leq x \leq 0.8$, $0 \leq y \leq 0.5$, $0.1 \leq x+y0.8$, and $0 \leq \delta \leq 0.5$ and Me is at least one member selected from the group consisting of Mn, Fe, and Co.

Once again, the film of the compound of the above formula may be formed on the substrate through an amorphous film by which the orientation of the crystallographic axes in the film is ensured even when the substrate is made of a polycrystalline or sintered ceramic material or a metal.

According to another embodiment of the invention, there is also provided an element in which another film of a perovskite compound of the formula (II)

$$ABO_3 \qquad (II)$$

in which A represents at least one member selected from the group consisting of Pb and Ba, and B represents at least one member selected from the group consisting of Ti and Zr, is formed on the oriented film of the perovskite compound (I) indicated above with or without the amorphous film. In the formula (II), Pb may be partially substituted with La. The film of the compound of the formula, $ABO_3$, is epitaxially grown on the first perovskite oxide film, so that it is also crystallographically oriented. Likewise, a perovskite-like compound of the following formula (III) having superconductivity may be formed, instead of the perovskite compound of the formula (II), on the film of the compound (I)

$$MBa_2Cu_3O_{7-z} \qquad (III)$$

in which M represents at least one member selected from the group consisting of Y, Lu, Yb, Tm, Er, Ho, Dy and Gd, and $0 \leq z \leq 0.5$.

All the embodiments described above are based on the finding that the compound of the formula (I) can be conveniently formed as crystallographically oriented on a non-oriented substrate whose crystallographic axes are free of orientation. The elements obtained in the respective embodiments are suitably applicable to piezoelectric devices, pyroelectric heat detectors, light modulators and other devices. With the superconductive film-bearing element, it may be applied as a proximity effect-type Josephson device or devices utilizing the anisotropy of the superconductor.

According to the invention, there is also provided a process for making an oriented film of the perovskite compound (I) which comprises subjecting a target of a perovskite compound of the formula (I) to RF or DC sputtering on a non-oriented substrate in an atmosphere of argon or a mixed gas of argon and oxygen at a substrate temperature of 200° and 700° C. at an input power sufficient for crystallographic orientation of the resultant film of the perovskite compound to be deposited on the non-oriented substrate, thereby forming a crystallographically oriented film of the perovskite compound (I) on the non-oriented substrate. The non-oriented substrate may be made of glasses, metals, sintered ceramics, and the like as will be described in detail hereinafter.

DETAILED DESCRIPTION AND EMBODIMENTS OF THE INVENTION

Figure 1:
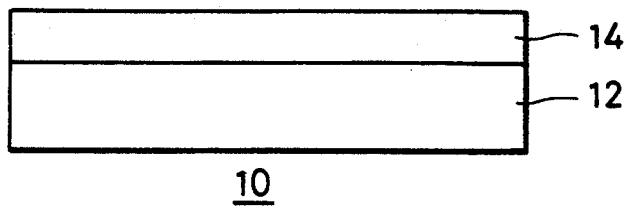
FIG. 1 is a schematic side view of a fundamental element according to one embodiment of the invention.

The present invention fundamentally provides an element which comprises an non-oriented substrate of a material whose crystallographic axes are substantially free of orientation, and an crystallographically oriented film of a perovskite compound of the following general formula (I) formed on the substrate

$$La_{1-x-y}Sr_xBa_yMeO_{3-\delta} \qquad (I)$$

in which $0 \leq x \leq 0.8$, $0 \leq y \leq 0.5$, $0.1 \leq x+y \leq 0.8$, and $0 \leq \delta \leq 0.5$ and Me represents at least one member selected from the group consisting of Mn, Fe and Co. The element according to the above embodiment is particularly shown in FIG. 1 in which the element is generally indicated at 10. The element 10 includes non-oriented substrate 12 and a film 14 of the perovskite compound (I) formed on the substrate 12. It will be noted that, throughout the drawings, like reference numerals indicate like members.

Typical examples of the compound (I) include $La_{0.5}Sr_{0.5}CoO_3$, $La_{0.7}Ba_{0.3}CoO_3$, $La_{0.6}Sr_{0.4}MnO_3$, $La_{0.7}Sr_{0.3}Mn_{0.5}Fe_{0.5}O_{3-d}$, and the like. The non-oriented substrate on which the oriented film is deposited may be made of amorphous materials such as various glasses, e.g. quartz glass, metals such as aluminum, gold, platinum and the like, sintered ceramics or polycrstalline material such as $Al_2O_3$, $ZrO_2$ and the like. This substrate may have any form such as a disk, a sheet, a plate, a film and the like.

The perovskite compound (I) is susceptible to orientation and is relatively readily converted into an oriented film on an inexpensive non-oriented substrate by a sputtering technique as has never been reported hitherto. The oriented film is a product which is obtained by a process which comprises subjecting the starting perovskite compound (I) to sputtering under conditions sufficient to cause the resultant film to be crystallographically oriented. The degree of orientation is greatly influenced by input power and a substrate temperature although the type of atmospheric gas and a gas pressure may influence the degree. In the practice of the invention, the sputtering is effected by application of an input power of not less than 0.80 W/cm$^2$, preferably not less than 1.22 W/cm$^2$, in an atmosphere of argon or a mixed gas of oxygen and argon at a substrate temperature of from 200° to 700° C. under a pressure of $10^{-3}$ to $10^{-1}$ Torr. When the input power is varied from 0.80 to 3.30 W/cm$^2$ at a substrate temperature of 200° C., the resultant film is converted from an amorphous state to an oriented state. The film is oriented to have a (110) plane at 0.80 to 1.60 W/cm$^2$, a mixture of (110) and (100) planes at 2.40 W/cm$^2$, and a (100) plane at 3.30 W/cm$^2$ when RF sputtering is used. Higher substrate temperatures will tend toward the (100) plane even at lower input powers. Using DC sputtering, the film tends to take a (110) plane at higher input power. The oriented film may be post-annealed at 700° to 800° C. in a stream of an oxygen gas. As a consequence, the film with a lower resistance is obtained.

The crystallinity depends greatly on a film-forming speed and a substrate temperature. If the film-forming speed is slow and the substrate temperature is low, an amorphous film is obtained. The film-forming speed is the fastest when argon gas alone is used. A larger amount of oxygen in the mixed gas results in a slower film-forming speed, but when a mixed gas containing molecular oxygen is employed, the resultant film has a composition closer to the composition of the target used. If a mixed gas of argon and oxygen is used, the content of oxygen is up to 50% by volume.

It should be noted that the starting powder of the compound (I) is readily obtained, as is known in the art, by weighing predetermined amounts of oxides, carbonates and/or nitrates of La, Sr, Ba and Co, thermally decomposing the weighed compounds at 400° to 500° C., and subjecting the decomposition matter to solid phase reaction at temperatures not lower than 900° C.

The perovskite compound of the formula (I) used in the present invention has several advantages. One of the advantages is that the compound has a pronounced tendency toward orientation when converted into a film by sputtering. In general, for obtaining a thin film of a perovskite compound whose crystallographic axes are oriented, a single crystal which has a lattice constant close to that of a material to be deposited as a film is used as a substrate. For instance, it is known that when a thin film of a tetragonal system perovskite compound of $PbTiO_3$ (a=3.904 angstroms, c=4.15 angstroms) is sputtered on a cubic system MgO (a=4.203 angstroms) single crystal substrate, an oriented film whose c axis is arranged vertical to the MgO substrate is epitaxially grown. The misfit of the lattice constant is 7.1%. In contrast, the perovskite compound of the formula (I) is capable of forming a thin film, whose crystallographic axes are neatly oriented, on a non-oriented substrate such as amorphous quartz glass. If another perovskite compound such as $PbTiO_3$, PLZT or $BaTiO_3$ is epitaxially grown on the oriented film of the perovskite compound (I) as a substrate, a thin film element having a crystallographically oriented layer of a perovskite compound of the type which has been hitherto formed on a single crystal substrate can be obtained inexpensively without use of any expensive single crystal substrate.

Another advantage of the thin film of the perovskite compound of the formula (I) is that this perovskite compound is electrically conductive in nature. The specific resistance of the perovskite compound is so low that the thin film serves as an electrode. For example, $La_{0.5}Sr_{0.5}CoO_3$ has a specific resistance of up to about $5 \times 10^{-4}$ ohms-cm. Although the specific resistance greatly varies depending on the type of Me and the values of x and y in the formula (I), the specific resistance can be controlled at a level of less than $10^{-1}$ ohms-cm when $0 \leq x \leq 0.8$, $0 \leq y \leq 0.8$, $0.1 \leq x+y \leq 0.8$, $0 \leq \delta \leq 0.5$, and Me is Mn, Fe and/or Co. It will be noted that the deficient amount of oxygen, $\delta$, can be arbitrarily controlled by controlling the composition of the atmospheric gas and the substrate temperature.

The perovskite compound of the formula (I) has a crystal form of cubic lattices or rhombic lattices slightly shifting from the cubic lattices. The thickness of the film 14 is usually in the range of from 0.1 to 10 micrometers.

Figure 2:
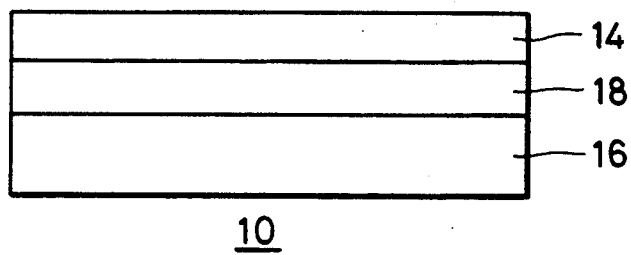
FIG. 2 is a schematic side view of an element according to another embodiment of the invention.

FIG. 2 shows another embodiment of the invention. In the figure, there is shown the element 10 which includes a polycrystalline substrate 16, an amorphous film 18 and a film 14 of the perovskite compound of the formula (I) superposed in this order. It has been found that when the perovskite compound (I) is deposited on the polycrystalline substrate 16, the resultant film is less likely to be oriented than in the case using an amorphous substrate. In order to form a more oriented film of the compound (I), it is preferable to form the amorphous film 18 between the polycrystalline substrate 16 and the film 14. By this, the crystallographic orientation of the perovskite compound film as on an amorphous substrate or a single crystal substrate is realized on a polycrystalline substrate. For the formation of the amorphous film 18, it is most convenient to sputter the perovskite compound (I) under conditions of an input power not higher than 0.80 W/cm² while cooling the substrate to a temperature of 100° C. or below. The sputtering under these conditions causes the resultant film to be amorphous without crystallization. Subsequently, the substrate is heated to 200° C. or higher and a sputtering power is increased to 0.80 W/cm² or over, thereby forming an oriented film of the compound (I).

The polycrystalline substrate may be made of an alumina sintered product, a $ZrO_2$ sintered product, or the like. The formation of the amorphous layer may be applied to a case where a metallic substrate is used.

Although it is preferred that the amorphous film 18 is made of such a material as used for the oriented film 14, other types of materials such as $SiO_2$, Si, $Al_2O_3$ and the like may be used, if desired. If the compound of the formula (I) is used for both amorphous film 18 and oriented film 14, the amorphous film and the oriented film can be continuously deposited on a polycrystalline substrate while controlling sputtering conditions properly.

Figure 3:
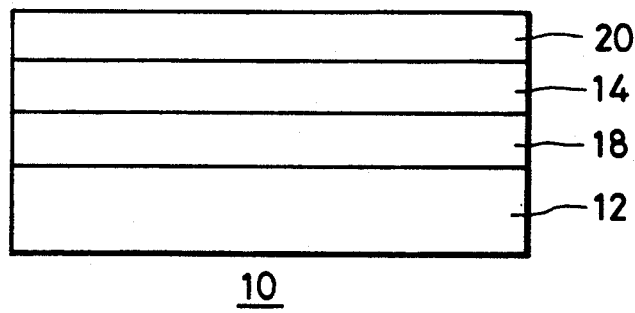
FIG. 3 is a schematic side view of elements according to further embodiments of the invention.

In the embodiments of FIGS. 2 and 3, the amorphous film is usually formed in a thickness of from 0.05 to 0.5 micrometers and the film of the compound (I) is formed in a thickness of from 0.1 to 10 micrometers for permitting the compound film to be oriented satisfactorily.

Further embodiments of the invention are shown in FIG. 3. In the figure, there is shown an element 10 which comprises a non-oriented substrate 12, a thin film 14 of the perovskite compound of the formula (I), and a film 20 of another perovskite compound, or a perovskite-like compound serving as a superconductive material as will be described hereinafter. If the substrate 12 is made of a polycrystalline material such as an alumina sintered product, an amorphous film 18 is preferably formed between the substrate 12 and the film 14 as is shown in FIG. 3. In this connection, however, if the substrate 12 is made of a glass, the amorphous film 18 is not necessary as in the case of FIG. 1. When a metal is used as the substrate 12, the amorphous film 18 may be or may not be formed.

In the embodiment of FIG. 3, the film 14 and/or the amorphous film 18 may be formed on the substrate 12 by sputtering in the same manner as described with respect to FIGS. 1 and 2.

Since the perovskite film 14 is crystallographically oriented, other types of perovskite compounds which have been hitherto formed as oriented on a single crystal substrate may be appropriately formed as the film 20 on this oriented film 14. For this purpose, perovskite compounds to be deposited on the film 14 should preferably be determined such that the misfit of the lattice constant relative to the perovskite compound of the formula (I) is within plus and minus 15%. In view of the function as a thin film element, perovskite compounds should preferably be ferroelectric materials. More particularly, ferroelectric perovskite compounds are those of the following general formula, $ABO_3$, in which A is at least one member selected from the group consisting of Pb and Ba, and B is at least one member selected from the group consisting of Ti and Zr. Pb represented by A may be partially substituted with La.

The conductive perovskite of the formula (I), $$La_{1-x-y}Sr_xBa_yCo_{3-\delta} \qquad (I)$$

in which x, y and $\delta$ have the meanings as defined before, respectively, is constituted, as crystallized, of cubic lattices or rhombic lattices slightly shifting from the cubic lattices. For instance, $La_{0.1}Sr_{0.9}Co_{0.2}Fe_{0.8}O_{3-\delta}$ is a cubic system having a=3,861 angstroms, which is very close to a=3.904 of $PbTiO_3$ and a=3.989 angstroms of $BaTiO_3$. Thus, the misfit is within several percent. Specific examples of the perovskite compounds useful as the film 20 include, aside from $PbTiO_3$ and $BaTiO_3$, $(PbLa)(TiZr)O_3$ (PLZT) although $BaMoO_3$, $BaZrO_3$, $SrMoO_3$, $LaAlO_3$, $LaTiO_3$, $SrTiO_3$ and the like may be used. If these, $PbTiO_3$, $BaTiO_3$ and PLZT exhibiting ferroelectric properties are preferred. This film 20 is epitaxially grown on the film of the perovskite compound (I) by sputtering by a usual manner.

Instead of the $ABO_3$ perovskite compound, a superconductive material may be used to form the film 20.

As is known in the art, many studies particularly on Y-Ba-Cu-O superconductors have been made with respect to sintered products. For fabricating the Josephson devices, it is essential that a superconductive material be formed into a thin film. In fact, several reports have been made on thin film formation by sputtering.

However, the thin film of $YBa_2Cu_3O_{7-z}$ has a superconduction transition temperature, Tc, as low as 17° K., which is significantly lower than the transition temperature of a ceramic or sintered product of about 100° K. Only when a single crystal of $SrTiO_3$ having a (001) plane is used as a substrate, the thin film has a transition temperature of 60° K. In these studies, insulating materials are used as a substrate. In order to make a proximity effect-type Josephson element or devices utilizing the anisotropy of $YBa_2Cu_3O_{7-z}$, it is necessary to form a thin film of the superconductor on a conductive substrate.

In the practice of the invention, a conductive thin film of the perovskite compound of the formula (I) can be formed as oriented to have a (110) plane or a (100) plane or a mixture of these planes as described hereinbefore with reference to FIGS. 1 and 2.

The compound of the formula, $MBa_2Cu_3O_{7-z}$, in which M represents at least one member selected from the group consisting of Y, Lu, Yb, Tm, Er, Ho, Dy and Gd and z is $0 \leq z \leq 0.5$, has a perovskite-like structure and exhibits superconductivity at a superconductive transition temperature. For obtaining a uniformly thin film of the above compound, a substrate to be deposited with the thin film, it is desirable to provide a substrate which has a crystal structure having lattice constants close to those of the compound. The perovskite compound (I) has a=3.80 to 3.90 angstroms. It has been reported that $YBa_2Cu_3O_{7-z}$ having a perovskite-like structure takes an orthorhombic system having a=3.89 angstroms, b=3.82 angstroms and c=11.7 angstroms or a tetragonal system having a=3.83 angstroms and c=11.7 angstroms. If the thin film of the perovskite compound (I) is oriented in such a way that the c axis is perpendicular to a substrate, a high-quality thin film of the superconductive material may be formed as using a single crystal of $SrTiO_3$ having a=3.90 angstroms.

The formation of a thin film of $YBa_2Cu_3O_{7-z}$ is effected by sputtering under conditions similar to those used for the perovskite compound of the formula (I). This superconductive material can be prepared by sintering oxides of the respective elements at high temperatures of 900 or over, mixing and sintering again. The film of the superconductive material formed on the film of the perovskite compound of the formula (I) having a (100) plane exhibits a high superconductive transition temperature and is thus preferred.

The present invention is described in more detail by way of examples. Comparative examples are also shown.

EXAMPLE 1

$La_{0.5}Sr_{0.5}CoO_3$ was provided as a perovskite oxide of the formula (I) and subjected to RF sputtering under the following conditions on a quartz substrate.

Sputtering conditions:
Gas atmosphere: Ar, Ar+$O_2$ (30% $O_2$), $O_2$
Substrate temperature: 250° C.
Substrate: quartz
Input power: 400 W
Target diameter: 12.5 cm
Pressure: $10^{-2}$ Torr.
Sputtering time: 2 hours The resulting films were subjected to X-ray analysis ($CuK_{\alpha}$) to determine the structure. The peaks of the X-ray diffraction pattern appeared appreciably at 23.3° and 47.5° corresponding to (100) and (200) planes, respectively, as expressed in terms of $2\theta$. However, crystallinity was not good when $O_2$ gas alone was used. The two lines alone were observed in a $2\theta$ range of from 20° to 70°.

EXAMPLE 2

The general procedure of Example 1 was repeated using DC sputtering. Similar results were obtained. The analysis of the X-ray diffraction pattern revealed that peaks of (110) and (220) planes were observed at 33.2° and 59.1° as $2\theta$, respectively.

The films obtained in Examples 1 and 2 were subjected to measurement of electric resistance, revealing that it was in the range of 10 to $10^{-2}$ ohms-cm. Moreover, when a film formation speed was checked, the speed in the atmosphere containing 30% of $O_2$ was ½ of the speed in Ar alone and the speed in $O_2$ alone was about 1/10 of the speed in Ar alone.

The above tendencies were confirmed using other perovskite oxides of the formula (1).

The films of these examples may be applicable as a thin film conductor or resistor, or may be utilized as a substrate which is crystallographically oriented.

EXAMPLE 3

Figure 4:
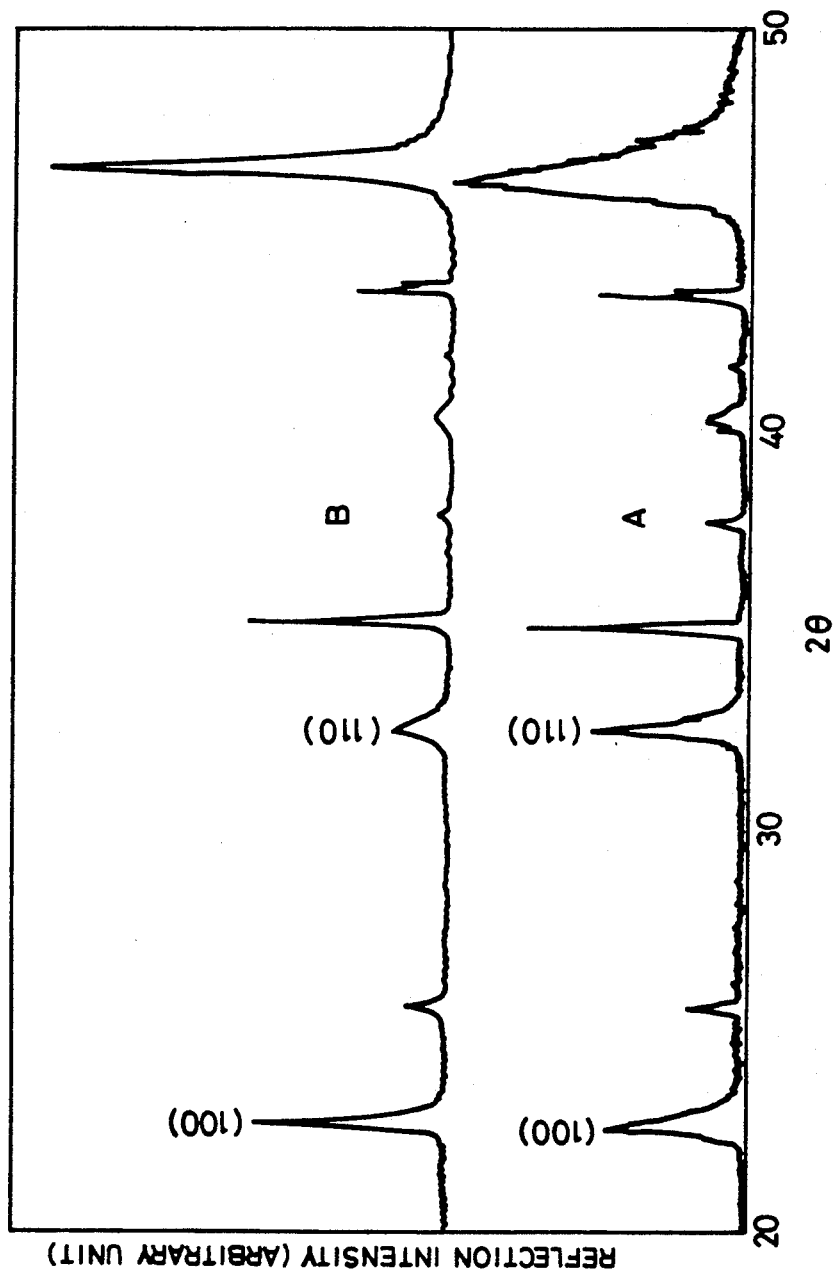
FIG. 4 is an X-ray diffraction pattern of a sputtered film of $La_{0.5}Sr_{0.5}CoO_{3-\delta}$ formed on an alumina substrate according to the invention.
Figure 5:
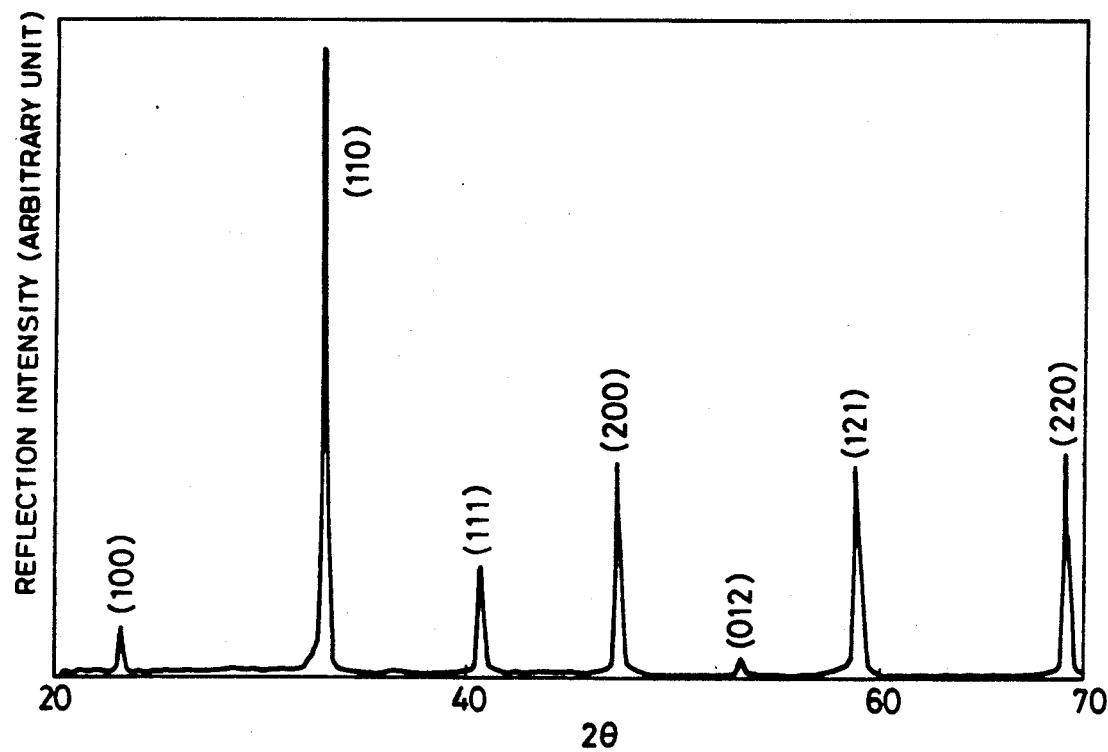
FIG. 5 is an X-ray diffraction pattern of a powder of $La_{0.5}Sr_{0.5}CoO_{3-\delta}$.

A powder of $La_{0.5}Sr_{0.5}CoO_3$ was placed in a RF sputtering apparatus as a target. An alumina polycrystalline plate was provided as a substrate. The sputtering zone of the sputtering apparatus was evacuated to a level of $5\times 10^{-6}$ Torr., into which Ar gas was introduced to a level of $5\times 10^{-3}$ Torr. The alumina substrate was heated and maintained at 200° C., followed by sputtering by application of 400 W from an RF electric supply. The X-ray diffraction pattern of the resultant thin film is shown in FIG. 4 as spectrum A. The X-ray diffraction pattern of a completely non-oriented powder of the perovskite oxide is shown in FIG. 5. When a reflection intensity ratio between a (100) line and a (110) line is taken as an index of a tendency to the orientation toward the (100) plane, (100)/(110)=8/97 for the non-oriented powder and (100)/(110)=19/22 for the film. However, the (110) line is larger than the (100) line, so that the degree of orientation is not so sharp but the film is usable in practical applications.

EXAMPLE 4

Using the same target, alumina sintered substrate and Ar gas pressure as used in Example 3, an amorphous film of the perovskite oxide as used in Example 3 was formed on the substrate by sputtering at an RF power of 100 W while cooling the substrate with water. Thereafter, the substrate was heated to 200° C., followed by sputtering at 400 W thereby forming a film on the amorphous film. The X-ray diffraction pattern of the thus formed film is shown in FIG. 4 as spectrum B. From the figure, it will be seen that the degree of orientation toward the (100) plane is high, with a reflection intensity ratio of (100) and (110) being 26/7. Thus, the formation of the amorphous film is considered effective.

EXAMPLE 5

The general procedure of Example 4 was repeated, thereby forming an amorphous thin film. Thereafter, a perovskite oxide as used in Example 4 was sputtered at a substrate temperature of 200° C. and at 200 W, thereby forming an oriented film on the amorphous film. The X-ray diffraction pattern of the oriented film revealed that the film had sharp peaks corresponding to (110) and (220) planes but (100) and (200) lines were rarely observed. Thus, an oriented film having a (110) plane other than a (100) plane was found to be obtained.

In the above example, although the amorphous film was made of the perovskite oxide as used for the oriented film, $Al_2O_3$ or $SiO_2$ may be used with similar results.

EXAMPLE 6

Figure 6:
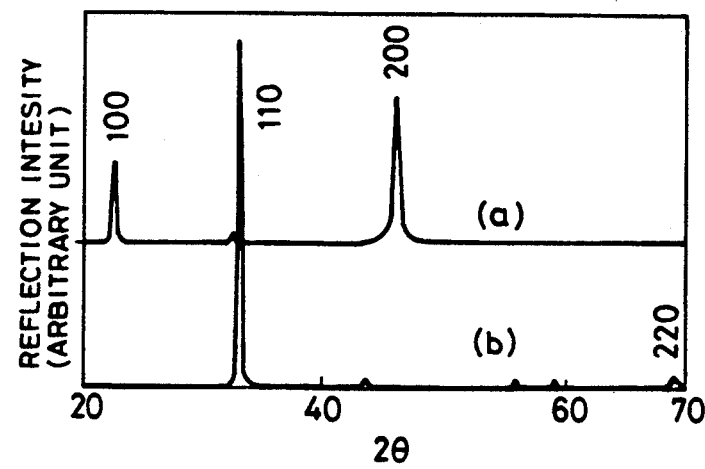
FIG. 6 is an X-ray diffraction pattern of each of sputtered films of $La_{0.5}Sr_{0.5}CoO_{3-\delta}$ formed on a quartz substrate under different sputtering conditions.

First, a powder of $La_{0.5}Sr_{0.5}CoO_3$ was subjected to RF sputtering on a quartz substrate in an atmosphere of a mixed gas of argon and oxygen with a ratio by volume of 3:1 under a pressure of $8 \times 10^{-3}$ to $2 \times 10^{-2}$ Torr., at a substrate temperature of 250° C. by application of 400 W with a target diameter of 12.5 cm, thereby forming a thin film of the perovskite oxide. The X-ray diffraction pattern of the film is shown in FIG. 6 as spectrum (a), which is similar to the spectrum B of FIG. 4. That is, the film is oriented to have a (100) plane. Spectrum (b) in FIG. 6 is for a thin film obtained under conditions of a reduced pressure of $1 \times 10^{-2}$ Torr., at a substrate temperature of 300° C. at 200 W.

As will be apparent from the above, the direction of orientation varies depending upon the sputtering conditions.

When the sputtering was effected at different RF powers of 100 W, 200 W, 300 W and 400 W, the film obtained was changed from an amorphous to slightly oriented state to oriented states. The films had a (110) plane at 200 W, a mixture of (110) and (100) planes at 300 W, and a (100) plane at 400 W, respectively.

On the $La_{0.5}Sr_{0.5}CoO_3$ film oriented as (100) was formed a thin film of $Pb_{0.9}La_{0.1}TiO_3$ by RF sputtering. For the sputtering, a powder having an excessive amount of PbO by 20 mole % was provided as a target. The sputtering was effected at a substrate temperature of 600° C. in an atmosphere of a mixed gas of argon and oxygen with a mixing ratio by volume of 9:1 under a reduced pressure of $2 \times 10^{-2}$ Torr.

The resultant film was subjected to X-ray diffraction analysis, revealing that reflections from (100) and (001) planes alone were observed. When reflection intensities of the (100) plane and the (001) plane are taken as $I_{100}$ and $I_{001}$, respectively, the degree of orientation, A, is $$A = I_{001}/(I_{001} + I_{100})$$

From this, A=96%.

For comparison, a Pt film oriented as (100) was formed on a MgO single crystal to provide a substrate. A film of $Pb_{0.9}La_{0.1}TiO_3$ was formed on the substrate under similar conditions as indicated above. The degree of orientation of the resultant film was 75%.

EXAMPLE 7

The general procedure of Example 6 was repeated in order to form a $Pb_{0.83}La_{0.13}Ti_{0.86}Zr_{0.14}O_3$ on a thin film of $La_{0.7}Sr_{0.3}Mn_{0.5}Fe_{0.5}O_{3-d}$ oriented as (100). The resultant film had a degree of orientation of 93%.

EXAMPLE 8

A thin film of $Ba_{0.5}Sr_{0.5}TiO_3$ was formed on a film of $La_{0.5}Sr_{0.5}CoO_{3-d}$ oriented as (110) by sputtering under conditions of a substrate temperature of 650° C. and a total pressure of $5 \times 10^{-2}$ Torr., in an atmosphere of a mixed gas of argon and oxygen with a mixing ratio by volume of 3:1. The resultant film had an X-ray diffraction pattern reflected from the (110) plane alone.

EXAMPLE 9

A film of $La_{0.5}Sr_{0.5}CoO_3$ was formed through an amorphous film of $La_{0.5}Sr_{0.5}CoO_3$ on a $ZrO_2$ sintered product substrate such that the perovskite oxide film was oriented to take a (001) plane as perpendicular to the substrate. Over the perovskite oxide film was formed a $YBa_2Cu_3O_{7-z}$ film where z is in the range of from 0 to 0.5 by RF sputtering. For the formation, a target material was prepared by mixing $Y_2O_3$, $SrCO_3$ and CuO at molar ratios of 0.5:2:3.6, sintering the mixture at 900° to 950° C. for 20 hours, and repeating the mixing and sintering several times. The CuO was added in excess by 20%. The sputtering was conducted at a substrate temperature of 650° C. under a total pressure of $2 \times 10^{-10}$ Torr., in an atmosphere of a mixed gas of argon and oxygen at a mixing ratio by volume of 9:1.

The thicknesses of the $La_{0.5}Sr_{0.5}CoO_3$ and $YBa_2Cu_3O_{7-z}$ were, respective, 1 micrometer and 3000 angstroms.

The resultant thin film was annealed at 700° C. in an oxygen gas. The specific resistances of the $La_{0.5}Sr_{0.5}CoO_3$ and $YBa_2Cu_3O_{7-z}$ at room temperature were, respectively, $3 \times 10^{-3}$ ohms-cm and $8 \times 10^{-3}$ ohms-cm. The superconduction transition temperature, Tc, of the $YBa_2Cu_3O_{7-z}$ was found to be 65° K.

EXAMPLE 10

The general procedure of example 9 was repeated except that $La_{0.8}Ba_{0.2}CoO_3$ was used instead of $La_{0.5}Sr_{0.5}CoO_3$, thereby obtaining a composite thin film. The transition temperature of the thin film was found to be 68° K.

COMPARATIVE EXAMPLE

The general procedure of Example 9 was repeated except that the $YBa_2Cu_3O_{7-z}$ thin film was directly formed on the $ZrO_2$ sintered product substrate without formation of the $La_{0.5}Sr_{0.5}CoO_3$ film. As a result, it was found the Tc=14° K.

As will be apparent from the Examples 9 and 10 and the Comparative Example, the superconductive thin film is formed on a conductive perovskite film which has been oriented to take a (001) plane which is perpendicular to the substrate, so that the superconduction transition temperature, Tc, was close to that of the superconductive thin film formed on ceramics.

What is claimed is:

1. An element which comprises a non-oriented substrate which is free of any orientation of crystallographic axes, and a crystallographically oriented film of a compound of the following general formula (I) formed on the substrate

$$La_{1-x-y}Sr_xBa_yMeO_{3-\delta} \qquad (I)$$

in which $0 \leq x \leq 0.8$, $0 \leq y \leq 0.5$, $0.1 \leq x+y \leq 0.8$, and $0 \leq \delta \leq 0.5$ and Me is at least one member selected from the group consisting of Mn, Fe and Co.

2. An element according to claim 1, wherein said film is oriented to have a (100) or (110) plane.

3. An element according to claim 1, wherein said film is a product obtained by a process of sputtering at an input power of not less 0.80 W/cm² in an atmosphere of argon or a mixed gas of oxygen and argon at a substrate temperature of from 200° to 700° C. under a pressure of $10^{-3}$ to $10^{-1}$ Torr.

4. An element according to claim 3, wherein the crystallographic orientation is controlled by the input power.

5. An element according to claim 3, wherein said input power is not less than 1.2 W/cm$^2$.

6. An element according to claim 3, wherein the sputtering process is an RF sputtering process.

7. An element according to claim 3, wherein the sputtering process is a DC sputtering process.

8. An element according to claim 1, wherein said compound is a member selected from the group consisting of $La_{0.5}Sr_{0.5}CoO_3$, $La_{0.7}Ba_{0.3}CoO_3$, $La_{0.6}Sr_{0.4}CoO_3$ and $La_{0.7}Sr_{0.3}Mn_{0.5}Fe_{0.5}O_3$.

9. An element according to claim 1, wherein said non-oriented substrate is made of an amorphous material.

10. An element according to claim 1, wherein said non-oriented substrate is made of a metal.

11. An element according to claim 1, wherein said non-oriented substrate is made of a sintered ceramic material.

12. An element according to claim 1, wherein said non-oriented substrate comprises a sintered ceramic material or metal layer and an amorphous film formed on the sintered ceramic material or metal layer.

13. An element according to claim 12, wherein said amorphous film is made of the compound of the formula (I).

14. An element according to claim 1 or 12, further comprising, formed on the film of the compound of the general formula (I), a film of a perovskite compound of the formula, $ABO_3$, wherein A represents at least one member selected from the group consisting of Pb and Ba and B represents at least one member selected from the group consisting of Ti and Zr.

15. An element according to claim 14, wherein when Pb is used as A, part of the Pb is substituted with La.

16. An element according to claim 14, wherein said perovskite compound is $PbTiO_3$.

17. An element according to claim 14, wherein said perovskite compound is $BaTiO_3$.

18. An element according to claim 14, wherein said perovskite compound is $PbLaTiZrO_3$.

19. An element according to claim 14, wherein said film of the perovskite compound of the formula, $ABO_3$, is oriented to have a (100) or (110) plane.

20. An element according to claim 1 or 12, further comprising, formed on the film of the compound of the general formula (I), a superconductive thin film made of $MBa_2Cu_3O_{7-z}$, wherein M represents at least one member selected from Y, Lu, Yb, Tm, Er, Ho, Dy and Gd and z is in the range of from 0 to 0.5.

21. An element according to claim 20, wherein said film of the compound of the general formula (I) is oriented to have a (100) plane.

* * * * *